(12) United States Patent
Ruderman et al.

(10) Patent No.: US 6,369,392 B1
(45) Date of Patent: Apr. 9, 2002

(54) CERIUM DOPED CRYSTALS

(75) Inventors: Warren Ruderman, Demarest; Ilya Zwieback, New Milford; Shai Livneh, Fair Lawn, all of NJ (US)

(73) Assignee: Inrad, Northvale, NJ (US)

( * ) Notice: Subject to any disclaimer, the term of this patent is extended or adjusted under 35 U.S.C. 154(b) by 0 days.

(21) Appl. No.: 09/480,075

(22) Filed: Jan. 10, 2000

(51) Int. Cl.[7] .............. G01J 1/42; G02B 5/22; F21V 9/04; C30B 29/12
(52) U.S. Cl. .............. 250/372; 117/940; 252/588
(58) Field of Search .............. 250/372; 117/940, 117/937; 252/588, 584; 423/464

(56) References Cited

U.S. PATENT DOCUMENTS

| | | | | |
|---|---|---|---|---|
| 4,167,490 A | * | 9/1979 | Looney | 252/588 |
| 4,217,166 A | * | 8/1980 | Nink | 117/940 |
| 5,837,054 A | * | 11/1998 | Singh | 117/940 |
| 6,126,869 A | * | 10/2000 | Haaland | 252/588 |

* cited by examiner

*Primary Examiner*—Georgia Epps
*Assistant Examiner*—Alicia M Harrington
(74) *Attorney, Agent, or Firm*—Stroock & Stroock & Lavan LLP

(57) ABSTRACT

A crystal having good optical transmission between 260 nm and 280 nm and strongly absorbing at 285 nm and higher, which is nonhydroscopic and stable at temperatures to 250° C. An example of such a crystal is Cerium doped $YLiF_4$. These properties make $YLiF_4$ crystals doped with $Ce^{3+}$ excellent materials for use as UV filters in the missile early warning spectral band. Optical devices including missile detection systems are also provided.

38 Claims, 4 Drawing Sheets

CERIUM DOPED CRYSTALS

BACKGROUND OF THE INVENTION

The invention relates generally to crystals that allow selected wavelengths of light to pass therethrough, and more particularly, to optical band-pass or rejection filters that operate in the ultraviolet (UV) spectrum.

A variety of optical devices utilize optical band-pass filters or rejection filters, which serve to reject unwanted wavelengths and permit only wavelengths belonging to a selected spectral band to pass therethrough. Crystals useful in rejection band-pass filters in the UV portion of the spectrum can be used for various applications, including solar-blind optical systems and missile warning systems. The following references discuss crystals and/or UV light filters and are incorporated herein by reference: M. A. Res et al., "Band-Pass Filters for Use in the Visible Region", *Appl. Opt.*, 16 (1977) 1908–1913; W. Luo and F. Zhu, "Longwave Ultraviolet Glass Filter Without Transmission of Infrared", *Appl. Opt.*, 29 (1990) 4549–4550; U.S. Pat. Nos. 5,788,765 and 5,837,054; M. H. L. Pryce et al., "Low-Temperature Absorption of Nickel Fluorosilicate Crystals", *Philos. Mag.*, 10 (1964) 477–496; G. H. Dieke et al., "The Spectra of the Doubly and Triply Ionized Rare Earths", *Appl. Opt.*, 2 (1963) 675–686; D. J. Ehrlich et al., "Ultraviolet Solid-State Ce YLF Laser at 325 nm", *Opt. Lett.*, 4 (1979) 184–186; S. L. Baldochi, K. Shimamura, K. Nakano, N. Mujilatu and T. Fukuda, "Ce.-doped $LiYF_4$ Growth Under $CF_4$ Atmosphere", *J Cryst. Growth*, 205 (1999) 537–542.

The light emitted from the exhaust of a jet engine of a missile comprises a broad spectrum, ranging from the infrared (IR) to the UV. Thus, a UV filter is needed to enable the system to distinguish the source of UV light from other natural sources of UV energy, such as the sun, moon, and stars.

Crystals of hydrated nickel salts and colored UV glasses are used conventionally in the construction of band-pass UV filters. The hydrated nickel salts that can be used for UV filters include nickel sulfate hexahydrate (chemical formula $NiSO_4.6H_{2O}$), nickel hexafluorosilicate hexahydrate (chemical formula $NiSiF_6.6H_2O$) and potassium nickel sulfate hexahydrate (chemical formula $K_2Ni(SO4)_2.6 H_2$). In the UV part of the spectrum, these materials are transparent at wavelengths less than 300 nm and block UV light having a longer wavelength. In UV band-pass filters, crystals of hydrated nickel salts can be used to reject UV wavelengths greater than 300 nm.

It is advantageous for an optical system used to detect the UV signal characterizing the jet engine of a missile to operate at various climate conditions, including those associated with elevated temperatures, which might be experienced in the desert. Also, temperatures of 85° C. or higher and low relative humidity conditions can be reached when aboard an aircraft, armored vehicle or a ship, as a combined result of both solar heating and engine-generated heat. Thus, the crystal should have not only proper spectral transmission but thermal stability. Unfortunately, the main drawback of the hydrated nickel salts is their low thermal stability. Upon heating, these materials start to lose their water of crystallization at temperatures as low as 60 to 65° C. for nickel sulfate and at 90 to 110° C. for the other two salts.

Standard UV glasses are available from several commercial manufacturers, including Schott (UG-5 and UG-11) and Hoya (U-360). Fundamentally, UV glass represents a phosphate glass matrix colored by additives of various metal oxides, such as CuO, CoO, $TiO_2$, NiO, $Cr_2O_3$, and $V_2O_5$. UV glasses are transmissive at desired UV wavelengths and highly absorptive at larger wavelengths. However, glass filter elements also have drawbacks. Although stable and rugged, they do not have sharply defined narrow absorption bands characteristic of crystals. Typically, absorption bands of a colored glass are broad and their boundaries are gradual with a typical slope of 0.1 db of absorption per nanometer. As a result, either the width of the band-pass or the maximum band-pass transmission must be compromised.

Therefore, there is a need for durable UV single crystal filter materials with narrow and sharp absorption bands in the UV portion of the optical spectrum.

SUMMARY OF THE INVENTION

Generally speaking, the invention is directed to crystals having good optical transmission between 250 nm and 300 nm, more preferably between 260 nm and 280 nm and absorb strongly at 285 nm and higher, and which are nonhydroscopic and stable at temperatures over 110° C. and even up to 250° C. for indefinite time periods. The crystals of the present invention are also stable when maintained at up to 50° C. and 90% relative humidity for at least 24 hours. An example of such a crystal is Cerium doped $YLiF_4$ single crystals. These properties make $YLiF_4$ crystals doped with $Ce^{3+}$ excellent materials for use as UV filters in the missile early warning spectral band. Optical devices including missile detection systems are also provided.

Accordingly, it is an object of the invention to provide an improved UV transmission crystal.

It is another object of the invention to provide a UV transmission crystal having high thermal stability.

Another object of the invention is to provide an improved missile detection system.

As to other objects and advantages of the invention, they will in part be obvious and will in part be apparent from the specification and drawings.

The invention comprises the several steps and the product resulting from such steps possessing the features, properties and relation of components which will be exemplified in the products and methods hereinafter described, and the scope of the invention will be indicated in the claims.

DETAILED DESCRIPTION OF THE PREFERRED EMBODIMENTS $Ce^{3+}$-doped $YLiF_4$ crystals were prepared and found to have optical properties that are advantageous for UV filters, including good optical transmission at wavelengths below 300 nm. In particular, the crystals of the present invention contain a narrow band of optical transmission between 260 and 280 nm with sharp boundaries and strongly absorbing above 285 nm. It is also found that under relevant operating conditions, the $YLiF_4$ crystal elements with polished surfaces are stabile at temperatures up to 250° C. for indefinite time periods.

The spectroscopic characteristics of the $Ce^{3+}$ ion are of particular interest. A neutral Ce atom has the following three outer electron shells: $4f^2$ (two orbital electrons), $6s^2$ (two electrons) and $5d^0$ (free). The 4f level is split into two sub-levels, $^2F_{5/2}$ and $^2F_{7/2}$, by spin-orbit interaction. A triply ionized $Ce^{3+}$ has a different configuration of the electron shells: $4f^1$ (one orbital electron), $5d^0$ (free) and $6s^0$ (free). Only one electron is present in the 4f orbit $Ce^{3+}$, which is considered as a ground level. The absorption/excitation line of the free $Ce^{3+}$ ion due to the transitions between the 4f level and the lowest 5d level is positioned near 46000 $cm^{-1}$, which corresponds to a wavelength of about 220 nm.

Figure 1:
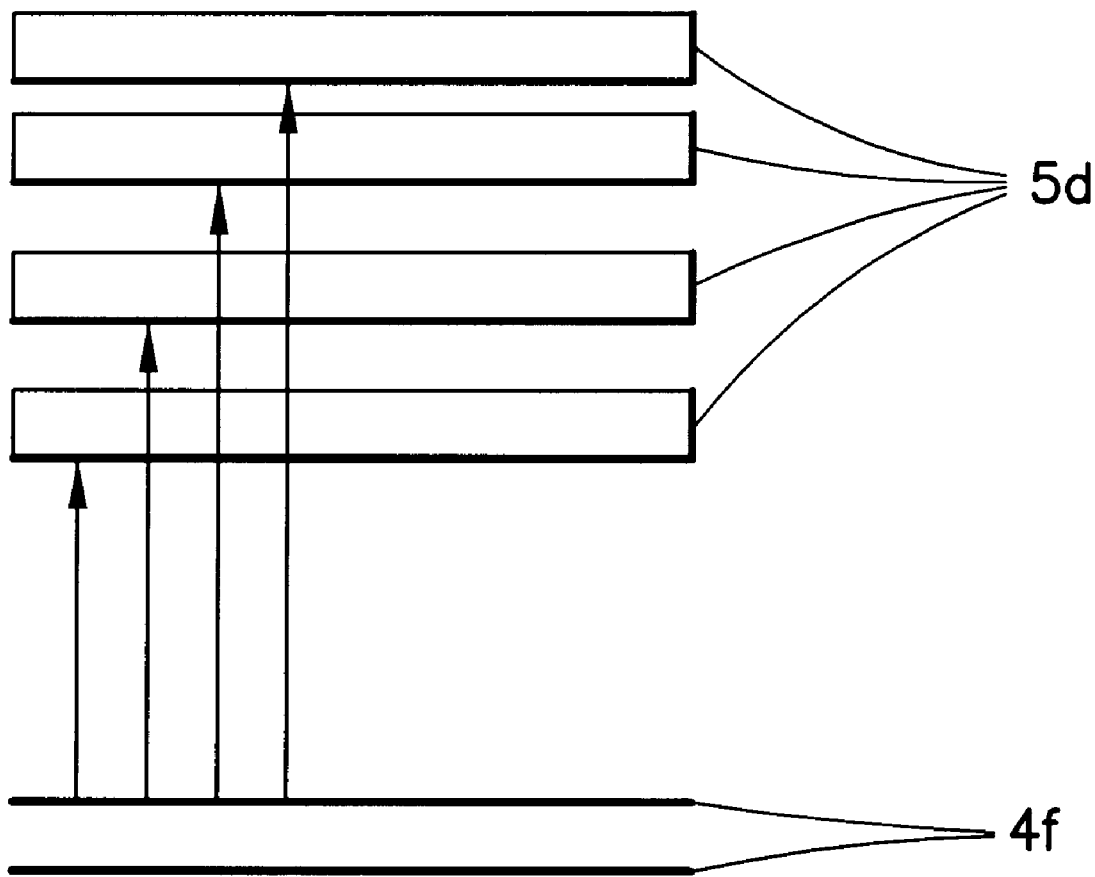
FIG. 1 is a schematic diagram of $Ce^{3+}$ energy levels in a crystal with 4-fold symmetry of crystal field.

When introduced into a crystal as a dopant, $Ce^{3+}$ may either occupy lattice sites or be in the interstitial positions. The ionic radius of $Ce^{3+}$ is equal to 1.03 Å, which is much smaller than a typical lattice parameter of a crystal. Therefore, independent of the position in the lattice, the crystal field will not disturb the inner electron shells of $Ce^{3+}$, including the 4f shell. By contrast, the 5d wave function of $Ce^{3+}$ is spatially large, and, therefore, the crystalline field of the host will affect it. As shown in FIG. 1, with cubic and tetragonal crystals having four-fold crystal field symmetry, the lower 5d orbital of $Ce^{3+}$ will be split into four sub-levels.

As a result of this splitting, the absorption spectra of a crystal doped with $Ce^{3+}$ will contain several UV absorption lines at wavelengths between 200 and 350 nm. This was found to make crystals doped with $Ce^{3+}$ very useful in band-pass UV optical filters operational in the UV missile early warning band.

A proper crystalline host for the $Ce^{3+}$ dopant, however, should be transparent in the UV part of the spectrum with the transparency at shorter wavelengths extending to at least 260 nm. It should also be nonhydroscopic, thermally stable, and exhibit a sufficient solubility of $Ce^{3+}$. Additionally, the host should have a crystal field strength and symmetry such that proper splitting of the 5d levels of $Ce^{3+}$ is achieved. In particular, little to no absorption should be produced in the 260 to 280 nm band as a result of such a splitting and the crystal should be strongly absorbing above 285 nm. Sufficiently large $Ce^{3+}$-doped single crystals should be able to be grown commercially.

It has been found that $YLiF_4$ crystals satisfy the above requirements needed for a $Ce^{3+}$ host. The $Ce^{3+}$-doped $YLiF_4$ crystals have been found to have very favorable mechanical properties that permit them to be machined and polished more easily than many other crystals operating in the same frequency bands. It has also been found that single crystals of $Ce^{3+}$-doped $YLiF_4$ large enough for practical applications in UV filters can be readily grown from $Ce^{3+}$-doped melts or solutions. Furthermore, good optical characteristics, high thermal stability, good mechanical properties and sufficiently large size of $YLiF_4$ crystals doped with $Ce^{3+}$ make them very useful for UV filters such as those operational in the UV missile early warning systems.

The following examples can be used to prepare the $YLiF_4:Ce^{3+}$ crystals in accordance with the invention, to characterize such crystals, to illustrate their thermal stability and to illustrate their end use. These examples are presented for purposes of illustration only and are not to be construed in the limiting sense.

EXAMPLE 1
Preparation of Crystal Growth Charge

Generally, fine powders of $YF_3$, LiF and $CeF_3$ are used for the preparation of a crystal growth charge. All these compounds are commercially available in a purity of 99.99% on the metal basis. These substances, however, are produced commercially by precipitation from aqueous solutions and contain a high concentration of absorbed water molecules or $OH^-$ radicals. Upon melting, the absorbed water, combined with the outgased water from the chamber walls, converts fluoride into oxyfluoride. The result of this is degraded optical transmission of the fluoride crystal in the UV spectrum. The heat treatment of the charge in the HF atmosphere (fluorination) is required to eliminate the harmful oxyfluoride contamination.

Figure 2:
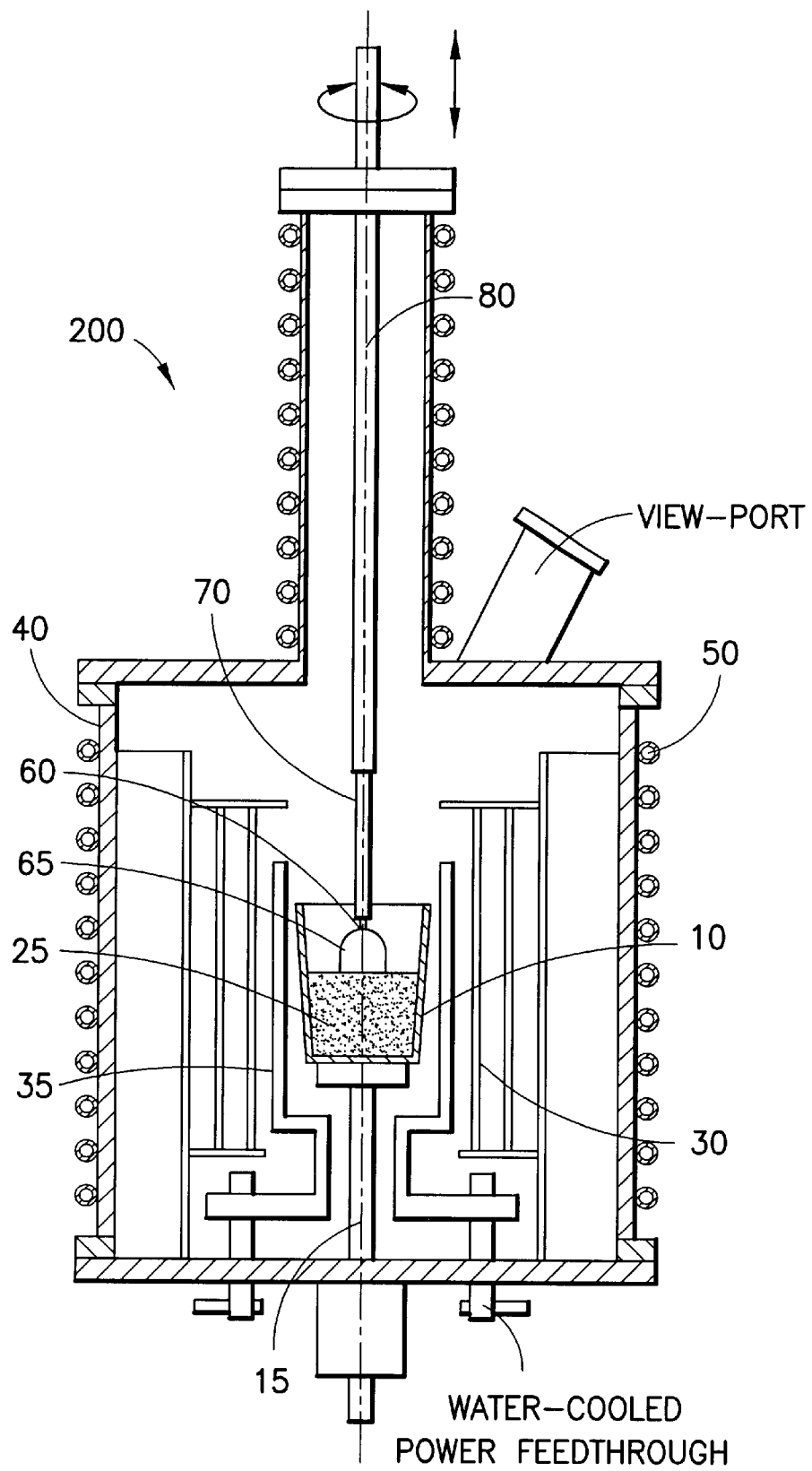
FIG. 2 is a schematic diagram of the growth of $Ce^{3+}$-doped $YLiF_4$ single crystal by the Czochralski technique.

An apparatus for growing, in particular, $YLiF_4:Ce^{3+}$ crystals, is shown generally as apparatus 200 in FIG. 2. A mixture 25 of $YF_3$ and LiF powders taken in a 49:51 molar ratio is loaded into a platinum crucible 10. The concentration of the $CeF_3$ additive in the mixture 25 is in the range between 1 to 3 mole % with respect to $YF_3$. Loaded crucible 10 is placed inside a cylindrical graphite heater 35, which together with a graphite heat shield assembly 30 is assembled in a stainless steel chamber 40 with a water-cooled wall 50. Chamber 40 is then evacuated to $1 \times 10^{-6}$ mm Hg and filled with pure and dry argon. This procedure is repeated several times.

Gaseous HF is then introduced, and charge 25 is baked at 500° C. in a dynamic atmosphere of pure Ar+10 vol. % HF to remove traces of oxyfluoride. Following this, the charge is melted in an atmosphere of pure Ar+0.1 vol. % $CF_4$.

EXAMPLE 2
Preparation of Seed Crystals $YLiF_4$ seeds crystals are prepared by cutting a section from previously grown single crystals. In the preferred embodiment, these seed crystals have a 5 mm×5 mm cross-section and are 25 to 30 mm long. Additionally, the orientation for the $YLiF_4$ seeds is chosen to be <001> or <100>. As will be discussed below in more detail, the $YLiF_4$ seeds are attached to a graphite seed-holder 70 using a platinum wire.

EXAMPLE 3
Growth of $YLiF_4:Ce^{3+}$ Single Crystals $YLiF_4$ single crystals can be grown by several techniques. In a preferred embodiment of the invention, $YLiF_4:Ce^{3+}$ crystal 65 is grown by the Czochralski technique, as shown in FIG. 2. In particular, crystal growth charge 25, as purified, is loaded into platinum crucible 10. Crucible 10 is positioned on a pedestal 15 inside resistive heater 35. Heater 35 and shields 30, both made of graphite, are mounted inside stainless steel chamber 40 with water-cooled walls 50. A $YLiF_4$ seed 60 is fastened to graphite seed-holder 70, preferably using a platinum wire, and seed-holder 70 is attached to a water-cooled shaft 80.

Chamber 40 is evacuated to $1 \times 10^{-6}$ mm Hg and filled with pure, dry argon. This procedure is repeated several times. Crystal growth is conducted in a dynamic atmosphere of pure argon with a small amount of $CF_4$ additive (0.1 to 0.2 vol. %).

Charge 25 is melted and soaked at a temperature slightly higher than the equilibrium melting point in order to homogenize the liquid and clear its surface from the residual oxide.

Thereafter, $YLiF_4$ seed 60 is rotated at a rate of 6 to 10 rpm and is brought in contact with the clear surface of the melt. Using fine temperature adjustments, a stable meniscus is established when neither melting nor crystallization occurs. Then, pulling starts with a pull rate of 0.2 to 0.3 mm per hour. A desired crystal diameter is maintained using fine adjustments of the power supplied to heater 35. Approximately one week is required to produce a $YLiF_4:Ce^{3+}$ crystal 65 having a diameter of 40 mm and a length of 60 mm.

Those skilled in the art will recognize that the temperatures, rates and times used in this method can be varied, although it is preferred that these parameters are within plus or minus 10% of the stated values.

EXAMPLE 4
Crystal Characterization

Figure 3:
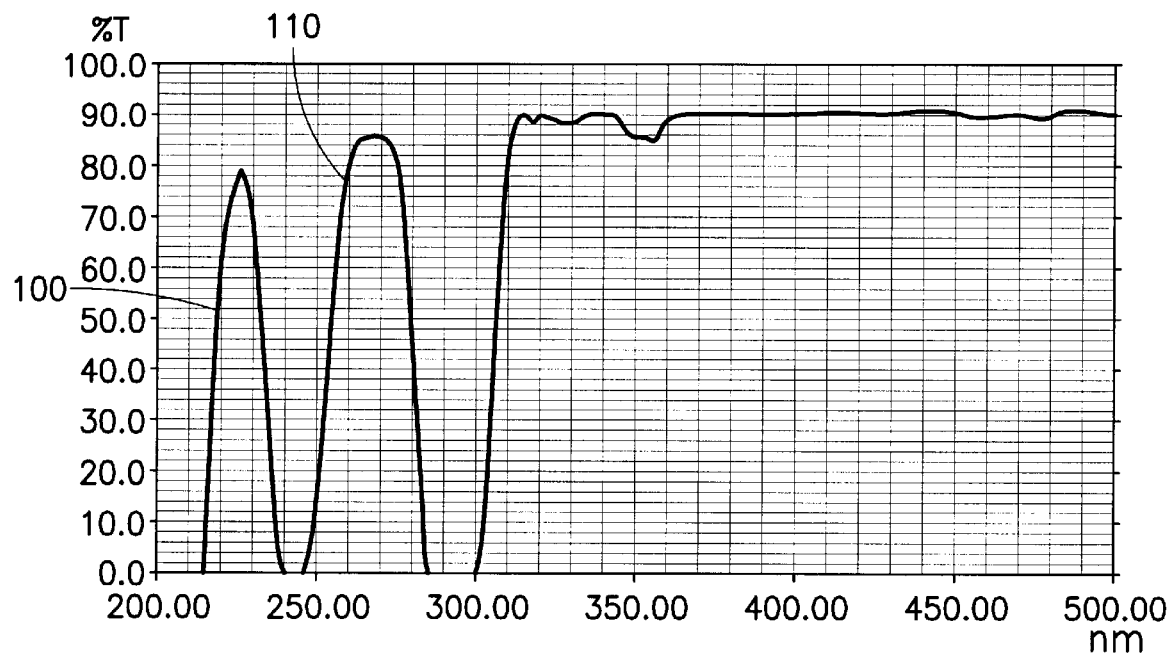
FIG. 3 is an optical transmission curve for an $YLiF_4$:$Ce^{3+}$ single crystal.

A 2 mm thick plate was cut from a grown $YLiF_4:Ce^{3+}$ single crystal and its surfaces were optically polished. Optical transmission of the plates measured using a Hitachi 4001 spectrophotometer is shown in FIG. 3. The spectrum demonstrates that the absorption quadruplet due to the 4f to 5d transitions of the $Ce^{3+}$ ion is present in $YLiF_4:Ce^{3+}$. In $YLiF_4:Ce^{3+}$ the quadruplet includes two lines at 292 nm and 242 nm and two lines (inseparable) near 200 nm.

The wavelength range between 260 and 280 nm is the most important for a UV band-pass filter designed to operate in the missile early warning band. The $Ce^{3+}$ absorption bands in $YLiF_4$ form two transmission windows. A first window 100 is at relatively short UV wavelengths and generally has no practical use. A second window 110 located at longer wavelengths (main window) offers an excellent transmission window. It stretches from 250 to 284 nm and the transmission peaks at approximately 269 nm.

The boundaries of the main transmission window are quite steep. In $YLiF_4:Ce^{3+}$ the slope of both long and short wavelength boundaries is over 0.1 db of optical density per nanometer and up to 0.3 db of optical density per nanometer.

EXAMPLE 5
Stability of $YLiF_4:Ce^{3+}$ Crystals Evaluated in an Oven Test

Thermal stability is a crucial parameter which determines the applicability of the material. The thermal stability of $YLiF_4:Ce^{3+}$ was evaluated in an oven test. Several elements 25 mm in diameter and 1 mm thick were cut from grown single crystals of $YLiF_4:Ce^{3+}$ and their large surfaces were polished. The polished elements were placed into a convection oven, heated to 250° C. and soaked at this temperature for three days.

After cooling the elements to room temperature, the elements were inspected under an optical microscope to detect any signs of decomposition or surface degradation. Optical transmission of the annealed samples was also measured. Neither changes in the optical transmission nor signs of decomposition in the bulk, nor surface degradation were detected. This evaluation showed that $YLiF_4:Ce^{3+}$ single crystals are thermally stable at temperatures at least up to 250° C., well above the 90° C. or 110° C. of various prior art materials.

EXAMPLE 6
Stability of $YLiF_4:Ce^{3+}$ Crystals Evaluated in a Climate Chamber Also evaluated was the stability of the grown crystals at high atmospheric humidity in a separate test. Polished samples of $YLiF_4:Ce^{3+}$ were placed into a climate chamber and maintained at 50° C. and 90% humidity for 24 hours. Inspection revealed no deterioration of the polished surfaces and no changes in the optical transmission of the samples.

EXAMPLE 7
Use in a Solar-Blind Optical System $YLiF_4:Ce^{3+}$ single crystals have been found to have the optical properties required for the UV band-pass filters operational in the missile early warning band, including the transmission band-pass between 260 and 280 nm with sharp boundaries. The crystals are nonhydroscopic and stable at temperatures up to 250° C. for indefinite time periods. This shows that $YLiF_4$ single crystals doped with $Ce^{3+}$ are excellent materials for UV filters in the missile early warning spectral band.

Figure 4:
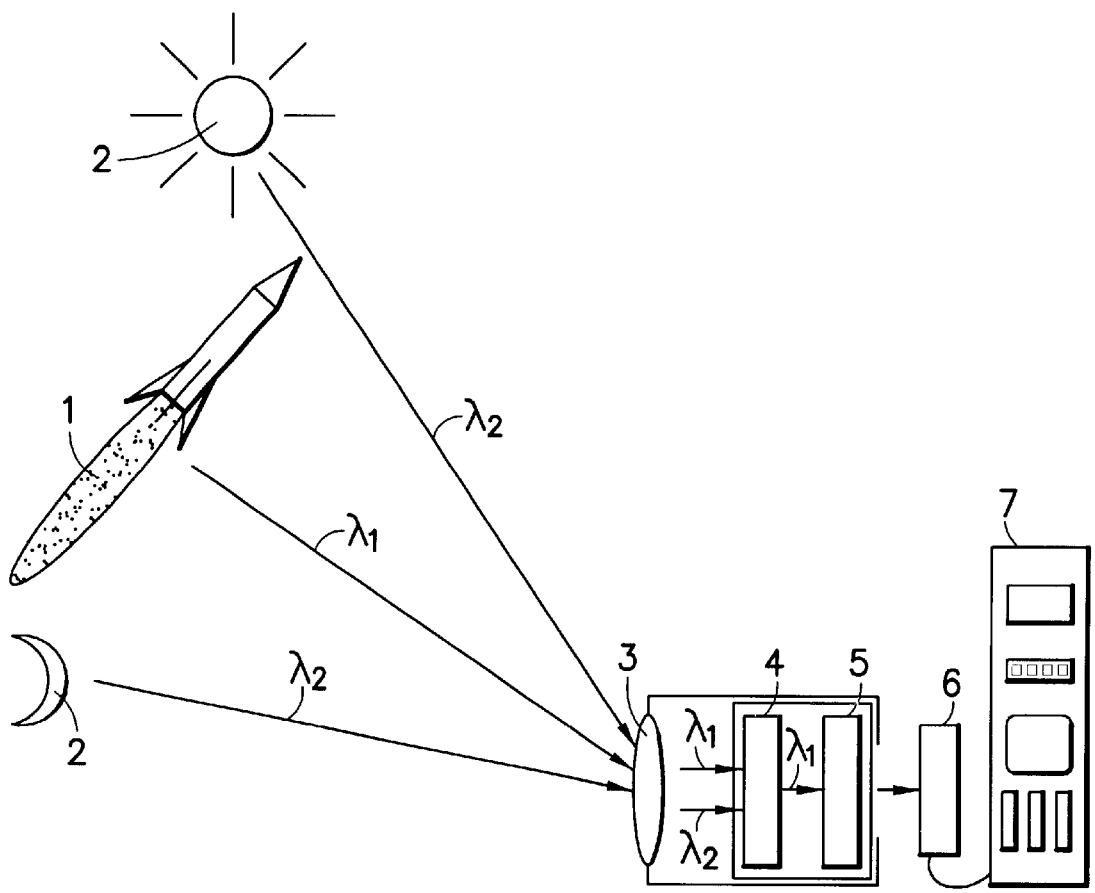
FIG. 4 is a schematic diagram of a solar-blind optical sensor which utilizes the $YLiF_4$:$Ce^{3+}$ crystal in accordance with the invention.

A schematic diagram of a solar-blind optical system utilizing the crystal of the present invention is presented in FIG. 4. An exhaust plum of a jet engine 1 emits UV light of a wavelength $\lambda_1$, which, together with broad spectrum light of a wavelength $\lambda_2$ originating from natural sources 2 (noise) such as the sun and the moon, is collected by a lens 3. The mixed light containing the useful signal at $\lambda_1$, and the noise at $\lambda_2$ is forwarded to a UV filter 4, which utilizes a $YLiF_4:Ce^{3+}$ crystal as a component. The filter rejects $\lambda_2$ and transmits $\lambda_1$ to other optical components 5 known in the art, and then to a sensor 6. The electronic signal developed by sensor 6 is amplified, processed, analyzed and displayed in an electronic circuitry 7.

Although certain preferred embodiments of the crystals, methods of making the crystals and devices which utilize that crystal have been described, it should be understood that the invention is not limited thereto, but may be variously embodied within the scope of the following claims.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. An UV light filter comprising a single crystal of $Ce^{3+}$-doped $YLiF_4$, characterized by the formula $YLiF_4:Ce^{3+}$.

2. The filter of claim 1, wherein said crystal transmits UV light in the band between 260 nm and 280 nm and blocks UV light at wavelengths less than 250 nm and greater than 300 nm.

3. The filter of claim 1, wherein said crystal has a diameter of at least 1 cm.

4. The filter of claim 1, wherein said crystal is stable over 110° C.

5. The filter of claim 1, wherein said crystal is stable up to 250° C.

6. An UV light sensor, comprising: a crystal of $Ce^{3+}$-doped $YLiF_4$ transmits UV light with wavelengths between 260 and 280 nm; and absorbs strongly above 285 nm; optical elements; and electronics which generate a signal from the transmitted UV light passed by the crystal and optical elements to indicate the detection of light in the 260 and 280 nm range.

7. A missile early warning system, comprising a crystal of $Ce^{3+}$-doped $YLiF_4$ which transmits UV light with wavelengths between 260 and 280 nm; and absorbs strongly above 285 nm; optical elements; and electronics which generate a signal from the transmitted UV light passed by the crystal and optical elements to indicate the detection of light in the 260 and 280 m range.

8. A method of growing crystals, comprising the steps of:

preparing a charge for crystal growth by combining a mixture comprising Y, Li, F and Ce;

purifying the crystal growth charge at an elevated temperature;

melting said crystal growth charge in an inert atmosphere to create a crystal growth charge solution;

bringing a crystal seed in contact with said solution;

growing a single crystal on said seed by rotating said seed;

removing said single crystal of a desired size from said solution by pulling said crystal from said solution; and lowering the temperature of said single crystal.

9. The method of claim 8, wherein the feed-stock comprises $YF_3$, LiF and $CeF_3$.

10. The method of claim 8, wherein the charge is purified in an atmosphere of inert gas and HF.

11. The method of claim 8, wherein the charge is melted in an atmosphere containing $CF_4$.

12. The method of claim 8, comprising pulling a $YLiF_4:Ce^{3+}$ crystal from the solution.

13. The method of claim 8, wherein said crystal growth charge is purified by fluorination.

14. The method of claim 8, wherein said $CeF_3$ additive in said charge has about a 1 to 3 mole % ratio with respect to $YF_3$.

15. The method of claim 8 wherein said seed crystal is rotated at 6 to 10 rpm.

16. The method of claim 8 wherein said crystal is pulled at a pulling rate of 0.2 to 0.3 mm per hour.

17. A method of growing crystals, comprising the steps of:

preparing $YLiF_4$ seeds from previously grown single $YLiF_4$ crystals;

preparing a crystal growth charge mixture comprising Y, F, Li and Ce by placing said mixture into a crucible which is placed on a pedestal inside a heater existing within a chamber, evacuating said chamber, filling said chamber with inert gas, removing oxyfluorides by baking said mixture in an inert atmosphere, and melting said mixture to create a solution;

fastening said seeds to a seed-holder evacuating said steel chamber to a low pressure;

filling said chamber with a pure, dry inert gas;

melting said solution;

rotating said seed in the solution; and pulling said seed from said solution.

18. The method of claim 17, comprising pulling a $YLiF_4:Ce^{3+}$ crystal from the solution.

19. The method of claim 17, wherein said crucible is made of platinum.

20. The method of claim 17, wherein said crystal growth charge mixture is formed by mixing $YF_3$, LiF and $CeF_3$.

21. The method of claim 17, wherein said $YLiF_4$ seeds are approximately 25 to 30 mm long.

22. The method of claim 17, wherein said inert atmosphere is pure Ar+10 vol. % HF.

23. The method of claim 17, wherein said seed is rotated at a rate of 6 to 10 rpm.

24. The method of claim 17, comprising the step of adding $CF_4$ to said chamber to remove traces of water.

25. The method of claim 17, wherein said crystal is pulled from said solution at a rate of 0.2 to 0.3 mm per hour.

26. The method of claim 17, comprising fastening a 5 mm×5 mm cross section seed crystal to the seed holder.

27. A crystal having the formula $YLiF_4:Ce^{3+}$.

28. A non-nickel based crystal substantially transparent to UV light in the 260 nm to 280 nm band and substantially absorbing UV light at less than approximately 250 nm and greater than approximately 285 nm, having thermal stability over 110° C.

29. The crystal of claim 28, comprising Y, Li, F and Ce.

30. The crystal of claim 28, wherein said crystal has thermal stability up to 250° C.

31. The crystal of claim 28 having the formula $YLiF_4:Ce^{3+}$.

32. The crystal of claim 28, wherein said crystal has a change in optical density with increasing wavelengths which is greater than 0.1 db of optical density per nanometer within the range of 250 to 260 nm.

33. The crystal of claim 28, wherein said crystal has a change in optical density with increasing wavelengths which is up to 0.3 db of optical density per nanometer within the range of 250 to 260 nm.

34. A crystal substantially transparent to UV light in the 260 nm to 280 nm band and substantially absorbing in the UV band less than 250 nm and greater than 285 nm, having thermal stability at least at approximately 50° C. at a relative humidity of about 90%.

35. The crystal of claim 34, comprising Y, Li, F and Ce.

36. The crystal of claim 34 having the formula $YLiF_4:Ce^{3+}$.

37. The crystal of claim 34, wherein said crystal has a change in optical density with increasing wavelengths which is greater than about 0.1 db of optical density per nanometer within the range of 250 to 260 nm.

38. The crystal of claim 34, wherein said crystal has a change in optical density with increasing wavelengths which is up to 0.3 db of optical density per nanometer within the range of 250 to 260 nm.

* * * * *